US006822389B2

(12) United States Patent
Kwasnick et al.

(10) Patent No.: US 6,822,389 B2
(45) Date of Patent: Nov. 23, 2004

(54) ARRAY DISPLAY INCLUDING RESILIENT MATERIAL IN THE SEAM

(75) Inventors: Robert F. Kwasnick, Palo Alto, CA (US); Stephen P. Sedaker, Vancouver, WA (US)

(73) Assignee: Intel Corporation, Santa Clara, CA (US)

( * ) Notice: Subject to any disclaimer, the term of this patent is extended or adjusted under 35 U.S.C. 154(b) by 115 days.

(21) Appl. No.: 09/975,367

(22) Filed: Oct. 11, 2001

(65) Prior Publication Data

US 2003/0071566 A1 Apr. 17, 2003

(51) Int. Cl.⁷ .............................. H01J 1/62; H05B 33/14

(52) U.S. Cl. .................... 313/500; 313/506; 313/110

(58) Field of Search ................. 313/504, 506, 313/110, 292, 500; 349/73, 74, 7, 153; 345/55, 1

(56) References Cited

U.S. PATENT DOCUMENTS

| 5,661,531 | A | * | 8/1997 | Greene et al. ................. 349/73 |
| 5,867,236 | A | * | 2/1999 | Babuka et al. ................ 349/73 |
| 5,889,568 | A | * | 3/1999 | Seraphim et al. ............. 349/73 |
| 5,903,328 | A | * | 5/1999 | Greene et al. ................. 349/73 |
| 6,476,783 | B2 | * | 11/2002 | Matthies et al. .............. 345/82 |
| 6,624,570 | B1 | * | 9/2003 | Nishio et al. ................ 313/506 |

FOREIGN PATENT DOCUMENTS

| WO | WO 99/41732 | 8/1999 |
| WO | WO 99/41787 | 8/1999 |
| WO | WO 99/41788 | 8/1999 |

* cited by examiner

Primary Examiner—Nimeshkumar D. Patel
Assistant Examiner—Karabi Guharay
(74) Attorney, Agent, or Firm—Trop, Pruner & Hu, P.C.

(57) ABSTRACT

An array display may be formed of panels that include a resilient material positioned around their edges. The resilient material may be black to promote a seamless appearance. Because the material is resilient, it may facilitate the interconnection of panels to form the array, preventing damage during assembly or thereafter.

17 Claims, 3 Drawing Sheets

ARRAY DISPLAY INCLUDING RESILIENT MATERIAL IN THE SEAM

BACKGROUND

This invention relates generally to displays made up of a plurality of tiles or panels that are abutted together, each panel forming a part of an overall displayed image so that the array display may show a composite image made up of the images contributed by each of the panels.

An array display may be formed from display panels. The display may be emissive displays including those using organic light emitting diodes (OLEDs). Each panel in turn may comprise an array of display modules comprising an emissive front part and a back part which is in electrical contact with rows and columns of the front part and may also comprise integrated circuits that are part of the array display drive circuitry.

Each module may include an array of pixels with row and column address lines. Each panel may further comprise an optical integrator plate in some cases to which the emissive side of the front part is attached.

The modules may be attached to a frame by way of heat spreaders, for example. The heat spreaders may be attached to the back member and integrated circuits by thermal attachment material such as thermal grease or epoxy with good thermal conductivity.

It is desirable that the seams between panels and modules be as unnoticeable as possible. To the extent that the seams between panels and modules are noticeable, the creation of a visually integrated, composite image made up of the contributions of all of the panels and modules is diminished. Thus, it is desirable, to the greatest possible extent, to create an array display that has a seamless appearance so that the user is not distracted by the fact that the overall display's image is made up of the contributions of a plurality of smaller units.

A black matrix of strips may be defined over a given module to obscure the boundaries between pixels. However, the black matrix on a module may be ineffective to obscure the boundaries between arrays of modules and arrays of panels.

Thus, there is a need for ways to improve the seamless appearance of array displays.

DETAILED DESCRIPTION

Figure 1:
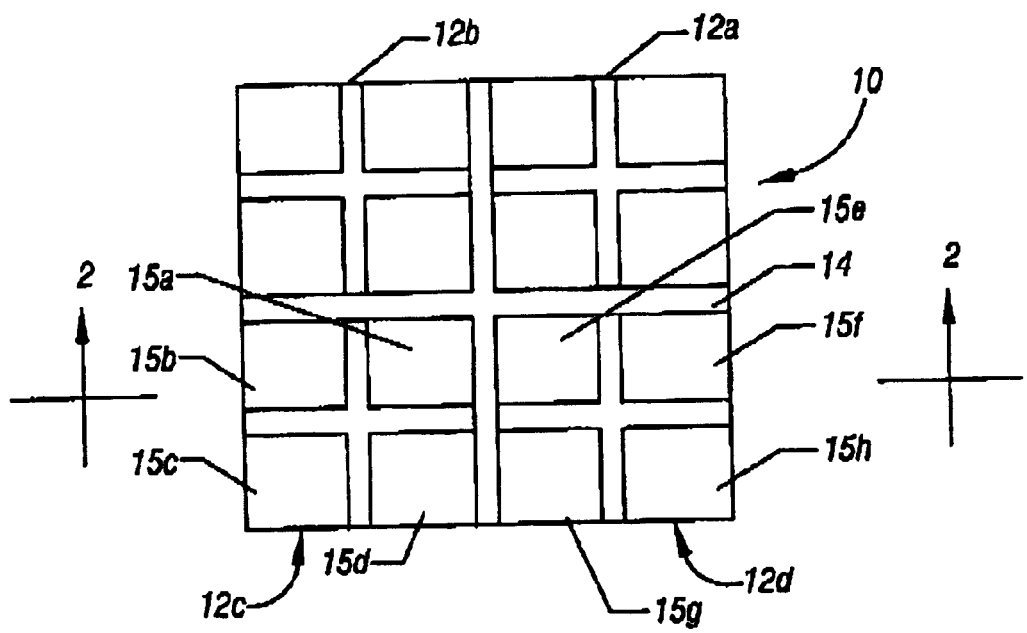
FIG. 1 is a top plan view of an array display in accordance with one embodiment of the present invention.

Referring to FIG. 1, an array display 10 may include a plurality of panels 12 that abut along gaps 14. Each panel 12, such as the panel 12C, may be made up of a plurality of modules 15. Each module 15 generates a portion of the overall image displayed by a panel 12 and each panel 12 creates a portion of the overall image displayed by the array display 10. Thus, the resulting composite image of the display 10 may be made up of the contributions to that image from the panels 12 and modules 15.

Figure 2:
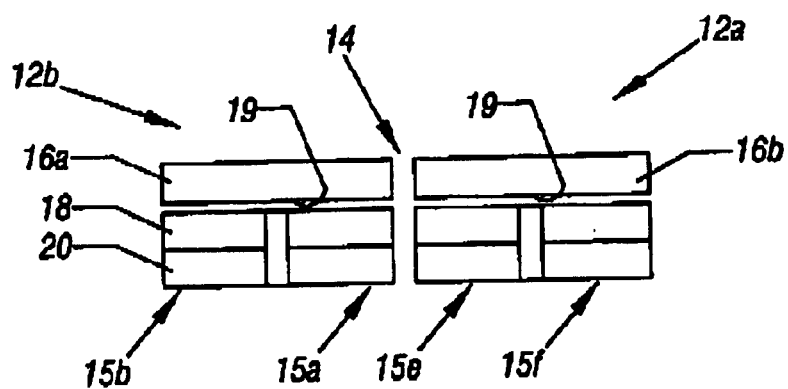
FIG. 2 is a cross-sectional view taken generally along the lines 2—2 in FIG. 1 during assembly.

In many applications, it may be advantageous to build larger displays from smaller modules and panels. For example, in one embodiment, building unitary larger displays may involve more complex manufacturing processes. In other cases, building unitary larger displays may result in greater losses because, if any portion of the larger display is defective, the whole display may be ruined. Array displays on the order of one thousand pixels are envisioned, with relatively large pixels, on the order of one millimeter or greater. Referring to FIG. 2, in one embodiment, the array display 10 includes an optical integrator plate 16, placed over the emissive side of each panel 12. Each plate 16 may have a black matrix (not shown in FIG. 2) formed on the rear side 19 of the plate 16 to obscure seams and gaps between adjacent pixels. In such case, a gap 14 exists between adjacent plates 16 (such as the plates 16a and 16b) and between underlying adjacent panels 12 (such as the panels 12a and 12b). Each module 15 may include front and back section 18 and 20 respectively.

Figure 3:
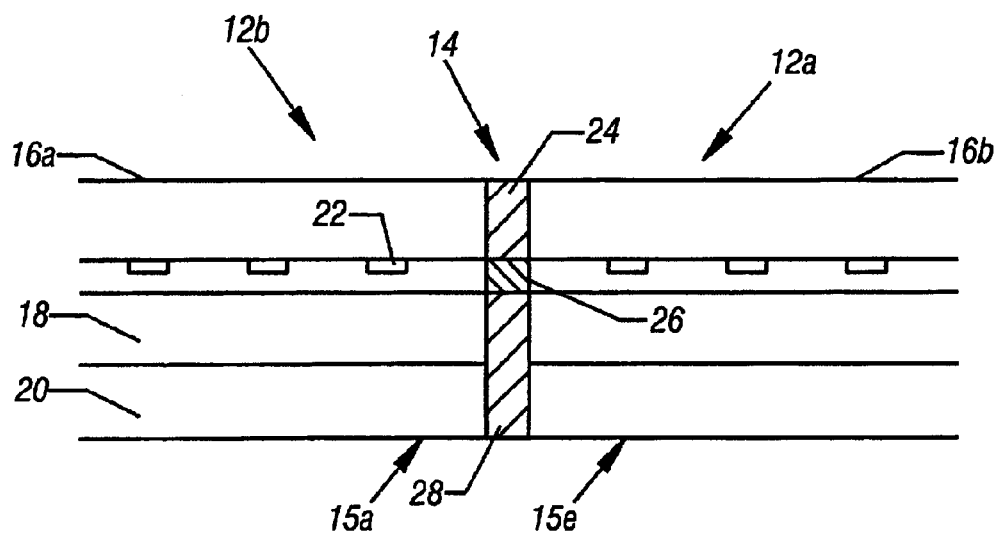
FIG. 3 is a partial, enlarged, cross-sectional view of the embodiment shown in FIG. 2 after assembly.

Referring to FIG. 3, a series of black matrix lines 22 may be formed on the underside of each optical integrator plate 16. In some embodiments, the black matrix lines 22 may be formed in transverse rows and columns spaced apart by the width of each pixel. Thus, the black matrix lines 22 frame each pixel and serve to reduce the ability to perceive specific pixels while increasing contrast between pixels in some embodiments.

The spaces between adjacent plates 16, such as plates 16a and 16b, may be filled with a filler material 24. The filler material 24 may be optically transparent and may have substantially the same index of refraction as the optical integrator plates 16 themselves. In some embodiments, that index of refraction is from about 1.3 to 1.5.

The portion of the gap 14 between the optical integrator plates 16 and the underlying modules 15 may be filled by a black material 26 that may be a resilient material such as silicone or foam. The material 26 may be of a color and size to closely match the black matrix lines 22. Also, the material 26 may be positioned to continue the regular pattern of spacing between block matrix lines 22, in some embodiments. In addition, the shininess or light reflection characteristics of the material 26 may match those of the black matrix lines 22. In general, the material 26 may substantially match the optical characteristics of the lines 22.

The material 26 may take on an appearance very similar to that of the black matrix lines 22. Thus, the combination of the appearances of the portions 24 and 26 with the black matrix lines 22 is to create an overall seamless appearance both between pixels and modules.

In addition, a separator 28 may be provided between adjacent modules 15, such as the modules 15a and 15e. In some embodiments, the separator 28 may be made of a resilient material that cushions any potential impacts or jostling between adjacent modules 15 either during assembly or during transportation. In one embodiment, the separator 28 may be formed of a resilient material such as a polymer such as silicone. If the separator 28 is applied in liquid form it may be applied with a syringe. Alternatively, expanding foam may be utilized as the separator 28.

In one embodiment, the separator 28 and material 26 may be made of the same material. In some embodiments, the material 26 and separator 28 may be integrated. In another embodiment, a temporary separator 28 may be applied to the modules 15 during transport.

Figure 4:
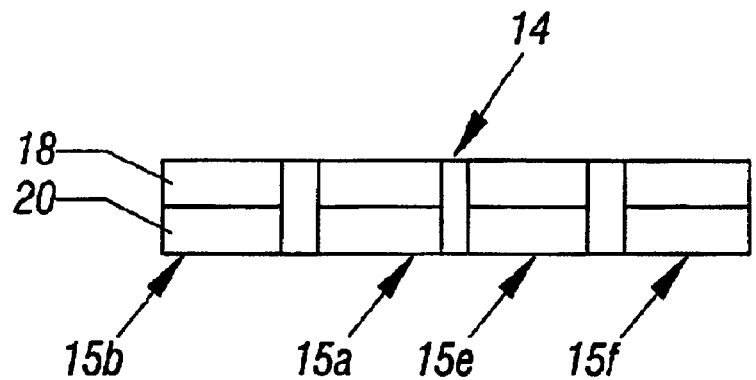
FIG. 4 is a cross-sectional view taken generally along the line 2—2 in FIG. 1 during assembly in accordance with another embodiment of the present invention.
Figure 5:
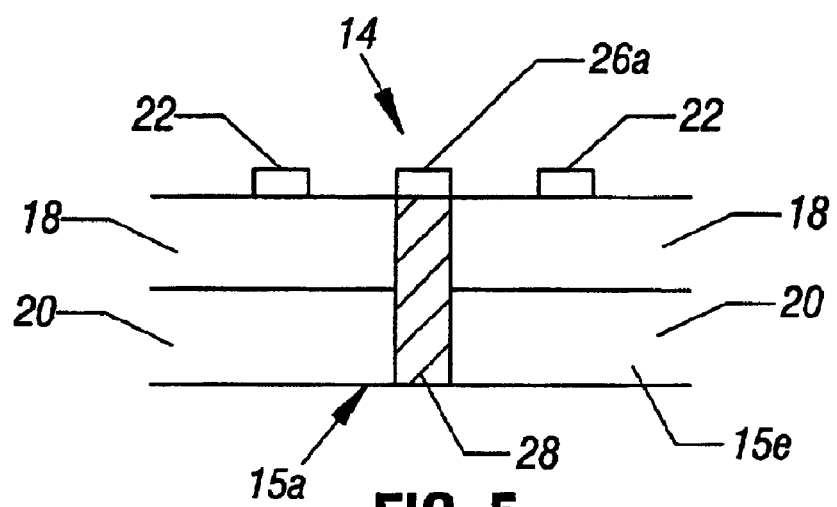
FIG. 5 is a partial enlarged view of the embodiment shown in FIG. 4, after assembly.

In some embodiments, the optical integrator plates 16 may not be utilized, as shown in FIG. 4. In such cases, the gap 14 may be filled with the separator 28 covered by the black material 26a, as shown in FIG. 5. That is, the separator 28 may form the entire seam from front to back of the display 10. In still another embodiment, the gap 14 may be filled by front and back portions, the front portion formed at least in part by the material 26a and the back portion formed at least in part by the separator 28.

As in the previous embodiment, the material 26a may be selected and configured to closely match the appearance of the black matrix lines 22. Again, the optical characteristics, as well as the spacing between the material 26a and adjacent black matrix lines 22, is such as to make the gap 14 not readily visible. Moreover, the size of the material 26a may be selected to substantially match that of adjacent black matrix lines 22. Thus, a relatively seamless appearance can be achieved through the construction of the material placed in the gap 14.

Similarly, the material 28 beneath the material 26a may be a resilient material as described previously to prevent jostling between adjacent modules 15, such as the modules 15a and 15e.

In some embodiments, the material 26a may be integrated with the material 28. Thus, the same material may be used as the material 26a and the separator 28.

In some embodiments, a thermal attachment material (not shown) and heat spreader (not shown) may be attached to the rear of the panels 12. In addition, a driver integrated circuit (not shown) may be attached between the panels 12 and the heat spreader. Electrical interconnects may be made by appropriate connectors or mounting frames in some embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An array display comprising:
    a plurality of panels abutted together in side-by-side arrangement to form an array and defining seams between adjacent panels;
    a seam material around the panels, the seam material of adjacent panels abutting to form the seam;
    optical integrator plates positioned over said panels; and
    a filler material between said plates.

2. The display of claim 1 wherein said seam material is a foam.

3. The display of claim 1 wherein said seam material is a polymer.

4. The display of claim 1 wherein said filler material matches the optical characteristics of said optical integrator plates.

5. The display of claim 1 wherein said seam material is positioned beneath said filler material, said seam material including an upper portion, said integrator plates including black matrix lines, said upper portion arranged to substantially match the optical characteristics of said black matrix lines.

6. The display of claim 5 wherein said upper portion is positioned between said optical integrator plates and said panels.

7. The display of claim 1, said upper surface of said panels including black matrix lines, said material including an upper portion that substantially matches the appearance of said black matrix lines.

8. The display of claim 7 wherein said upper portion is made of a material that is different from said resilient material.

9. A method comprising:
    abutting a plurality of panels together in side-by-side arrangement to form an array display;
    defining seams between adjacent panels;
    locating a resilient material around the periphery of each panel;
    abutting the resilient material of adjacent panels to form a seam;
    positioning optical integrator plates over said panels; with a filler
    filling the region between said optical integrator plates with a filler material.

10. The method of claim 9 including forming the seam of a resilient foam material.

11. The method of claim 9 including forming the seam of resilient silicone material.

12. The method of claim 9 including filling the region between said optical integrator plates and said panels with a filler material.

13. The method of claim 12 including matching the optical characteristics of said optical integrator plate with said filler material.

14. The method of claim 12 including providing a first seam material between said optical integrator plates, said first seam material being substantially transparent and matching the optical characteristics of said optical integrator plates.

15. The method of claim 14 including providing a second seam material beneath said first seam material to match the appearance of black matrix lines on said optical integrator plates.

16. The method of claim 15 including providing a third seam material below said second seam material and between said panels, said third seam material being resilient.

17. The method of claim 9 including providing black lines over said resilient material and said panels, a black line over said resilient material optically matching the black lines over said panels.

* * * * *

UNITED STATES PATENT AND TRADEMARK OFFICE
CERTIFICATE OF CORRECTION

PATENT NO. : 6,822,389 B2
DATED : November 23, 2004
INVENTOR(S) : Robert F. Kwasnick and Stephen P. Sedaker It is certified that error appears in the above-identified patent and that said Letters Patent is hereby corrected as shown below:

<u>Column 4,</u>
Lines 27-28, "with a filler" should be -- and --.

Signed and Sealed this

Fifth Day of April, 2005

JON W. DUDAS
*Director of the United States Patent and Trademark Office*